United States Patent
Kim et al.

(10) Patent No.: US 7,564,882 B2
(45) Date of Patent: Jul. 21, 2009

(54) INTEGRATED CIRCUIT HAVING ON-CHIP LASER BURN-IN CIRCUIT

(75) Inventors: Young Gon Kim, Mountain View, CA (US); Myunghee Lee, San Jose, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 442 days.

(21) Appl. No.: 10/903,179

(22) Filed: Jul. 30, 2004

(65) Prior Publication Data

US 2006/0023760 A1    Feb. 2, 2006

(51) Int. Cl.
*H01S 3/00* (2006.01)

(52) U.S. Cl. ............... 372/38.1; 372/38.02; 372/38.07; 372/38.09; 324/767

(58) Field of Classification Search ..... 372/38.1–38.09; 324/767
See application file for complete search history.

(56) References Cited

U.S. PATENT DOCUMENTS

| | | | |
|---|---|---|---|
| 5,617,036 A * | 4/1997 | Roff | 324/760 |
| 6,623,997 B2 | 9/2003 | Chang et al. | |
| 2002/0186744 A1* | 12/2002 | Cornelius et al. | 372/109 |
| 2003/0035451 A1* | 2/2003 | Ishida et al. | 372/38.02 |
| 2005/0213622 A1* | 9/2005 | Diaz | 372/38.02 |

\* cited by examiner

*Primary Examiner*—Minsun Harvey
*Assistant Examiner*—Tod T Van Roy

(57) ABSTRACT

An integrated circuit for providing burn-in current to a laser diode. The integrated circuit includes a laser driver having an output for connection to the laser diode. Burn-in circuitry is formed on the integrated circuit and generates a burn-in current. A switch is formed on the integrated circuit and couples the burn-in current to the laser diode in response to an enable signal.

18 Claims, 3 Drawing Sheets

INTEGRATED CIRCUIT HAVING ON-CHIP LASER BURN-IN CIRCUIT

BACKGROUND

Increasingly, data communications involve transmissions by optical sources that can deliver high volumes of digitized information as pulses of light. This is especially true for many communication companies that utilize laser diodes and optical fibers as their primary means for the transmission of voice, television and data signals for ground-based communications networks.

To achieve high bandwidth, laser diodes such as edge-emitting lasers and Vertical Cavity Surface Emitting Lasers (VCSELs) are commonly utilized as optical sources. These types of laser diodes are preferred due to their minute dimensions. For example, the typical VCSEL is measured in the order of micrometers. Consequently, an array of laser diodes can be integrated into a system to achieve high bandwidth transmissions.

In the manufacturing and production of VCSEL arrays, such as 1×12 or 1×4 parallel channel optical arrays, target optical and electrical characteristics are assigned to the arrays. To determine whether the VCSEL arrays will be operating at their target levels, each laser diode of the array is subjected to a burn-in process. That is, each VCSEL must be submitted to a quality control (QC) procedure that includes subjecting the VCSEL to a constant current at an elevated temperature for an extended time period. The burn-in current can be selected to be at a level that is higher than the standard operating current, since the QC procedure is a short-term test of whether the VCSELs will provide long-term performance during actual operating conditions. Similarly, the burn-in temperature is selected to be at a higher temperature than the anticipated operating temperature. Finally, the burn-in time period is selected on the basis of the type, specification and stringency of the devices.

Existing configurations use the laser driver to provide burn-in current to the laser diode. FIG. 1 is a block diagram of a conventional burn-in arrangement. Integrated circuit 10 includes an input buffer 12, limiting amplifier 14 and laser driver 16. An ASIC or other device provides signals to the integrated circuit 10 for applications such as communications. To perform the burn-in process, commands from an external digital controller 24 are submitted to an on-chip digital controller 22. The on-chip digital controller 22 sends commands to laser driver 16 that generates the high burn-in current for laser diode 20.

The use of an on-chip burn-in controller has several drawbacks. First, the on-chip digital controller 22 requires additional bonding pads on the integrated circuit 10. These extra pads add parasitics that degrade performance (e.g., eye quality), particularly for high transmission rates such as 2.5 Gbps or higher. Furthermore, bonding between the integrated circuit 10 and the digital controller 22 requires a delicate and difficult procedure.

Another drawback to the configuration of FIG. 1 is that the laser driver 16 provides the burn-in current. This may require redundant calibration circuitry used to control the accuracy of the laser driver 16 during the burn-in phase. Furthermore, using laser driver 16 as the burn-in current source may cause degradation of laser driver 16. The burn-in process is typically performed in a harsh environment (e.g., high temperature, high humidity), at a high DC current for a long time. This can result in degradation of laser driver 16.

SUMMARY OF INVENTION

An embodiment of the invention is an integrated circuit for providing burn-in current to a laser diode. The integrated circuit includes a laser driver having an output for connection to the laser diode. Burn-in circuitry is formed on the integrated circuit and generates a burn-in current. A switch is formed on the integrated circuit and couples the burn-in current to the laser diode in response to an enable signal.

Another embodiment of the invention is a system for performing burn-in including a current source generating an input current and a laser diode. An integrated circuit includes a laser driver having an output for connection to the laser diode, burn-in circuitry formed on the integrated circuit generating a burn-in current and a switch formed on the integrated circuit for coupling the burn-in current to the laser diode in response to an enable signal.

BRIEF DESCRIPTION OF DRAWINGS

FIG. 1 is a block diagram of a conventional system for laser diode burn-in.

DETAILED DESCRIPTION

Figure 1:
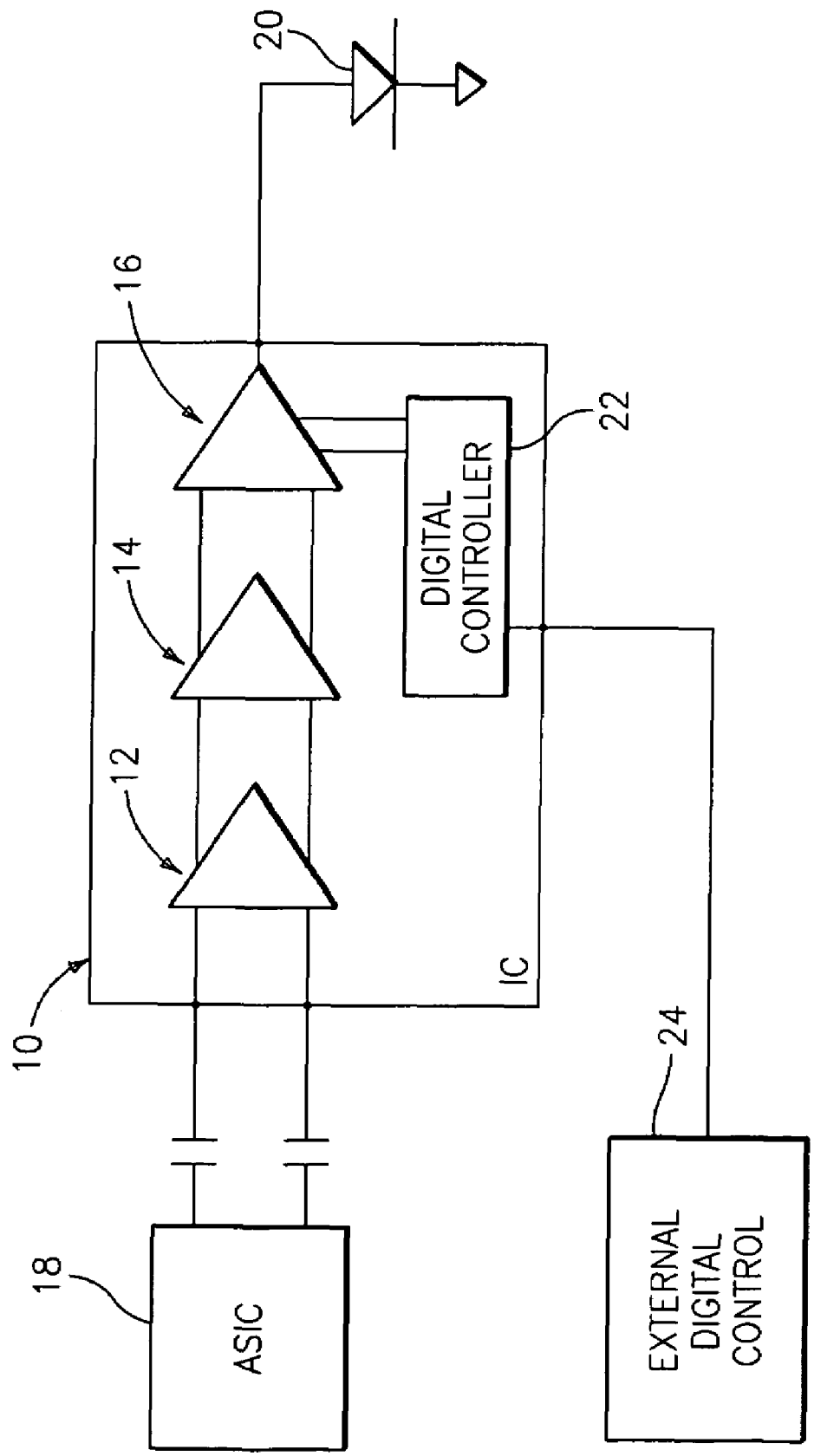
Figure 2:
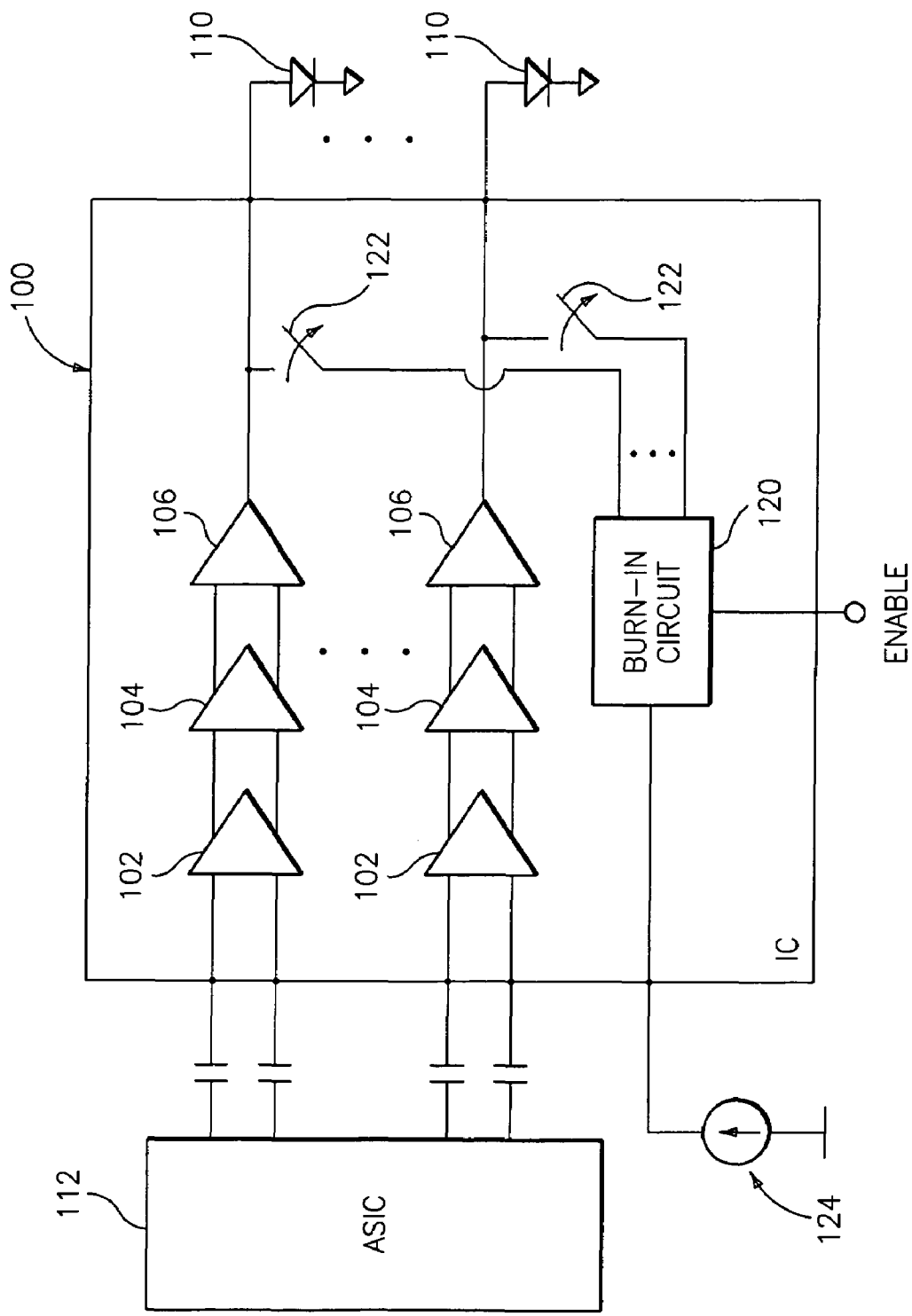
FIG. 2 is a block diagram of a system for laser diode burn-in in an embodiment of the invention.

FIG. 2 is a block diagram of a system for laser diode burn-in in an embodiment of the invention. In FIG. 2, integrated circuit 100 is an N-channel laser drive chip. Each channel includes an input buffer 102, a limiting amplifier 104, and a laser driver 106. Input buffer 102 stores signals from a communication device prior to transmission to the laser driver 106. Limiting amplifier 104 amplifies the output of input buffer 102 and provides the amplified signals to laser driver 106. Laser diver 106 drives laser diode 110 to generate optical signals for communications. An ASIC 112 provides signals to each channel for communications. The laser diodes 110 may be part of a VCSEL in a communications device, such as a fiber optic transmitter.

Integrated circuit 100 includes a burn-in circuit 120. As described in further detail herein, the burn-in circuit 120 generates burn-in current for the laser diodes 110 during the burn-in process. The burn-in circuit 120 is formed in the integrated circuit 100 and may be implemented in BiCMOS circuits. The burn-in circuit 120 includes N-outputs connected to each of the N laser diodes through switches 122. A current source 124 provides a precise current to the burn-in circuit 120. In exemplary embodiments, the burn-in circuit amplifies the input current and generates a burn-in current that is fed to the laser diodes 110 through switches 122. An enable signal is provided to the burn-in circuit to activate the amplifier and close switches 122. In alternate embodiments, the burn-in circuit serves as a signal buffer that buffers the input current without amplification.

Figure 3:
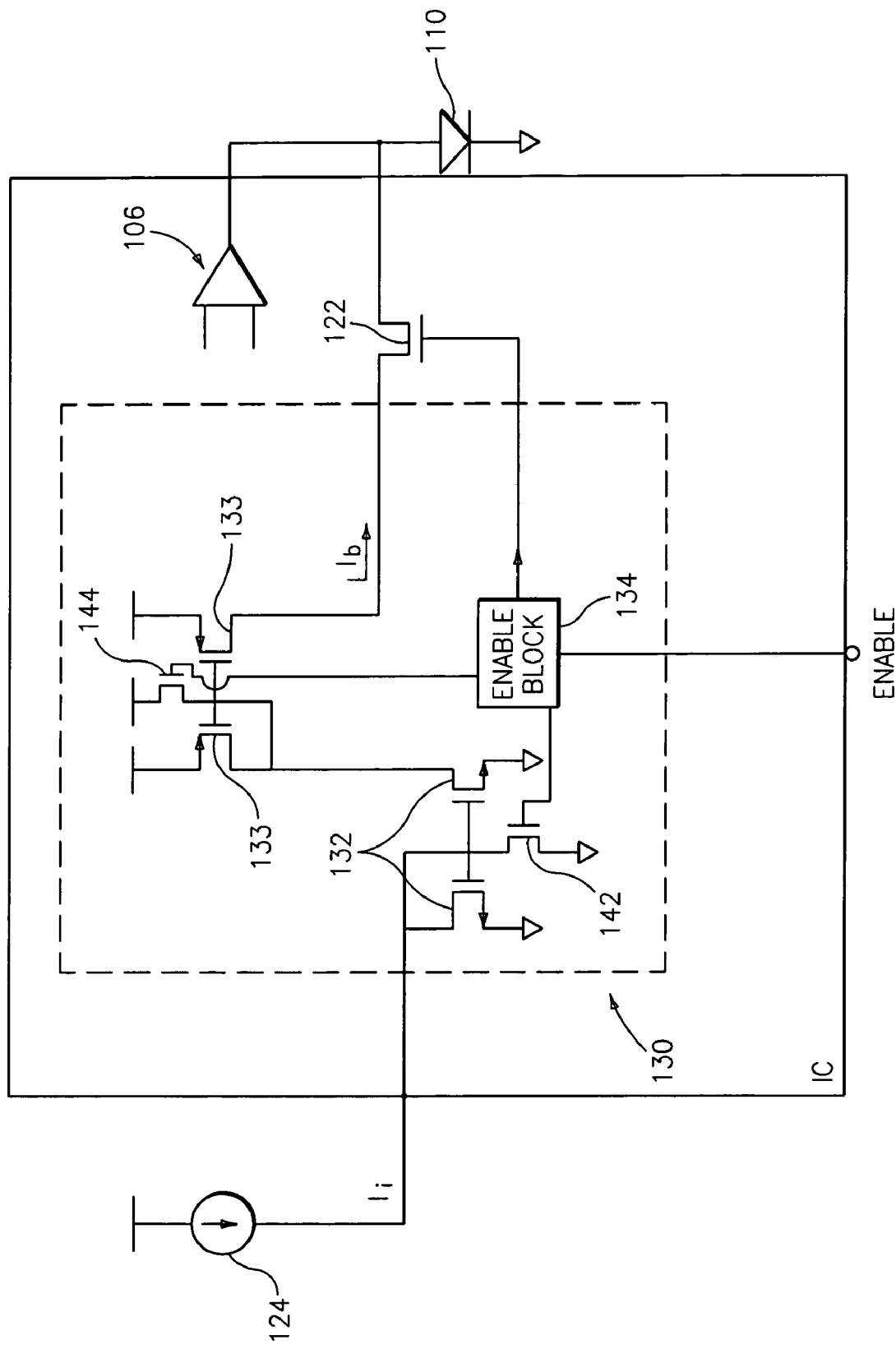
FIG. 3 is a schematic diagram of an on-chip burn-in circuit in an embodiment of the invention.

FIG. 3 is schematic diagram of an on-chip burn-in circuit in an embodiment of the invention. Portions of integrated circuit 100 are not shown for ease of illustration. Shown in FIG. 3 is one section 130 of the burn-in circuit 120 generating burn-in current for one laser diode. Circuit section 130 includes an amplifier to amplify current from current source 124 and provide the amplified current to laser diode 110. In the embodiment shown in FIG. 3, the amplifier is a current mirror configuration implemented through field effect transistors 132 and 133. Input current Ii from current source 124 is amplified to produce burn-in current Ib. Alternatively, the burin-in circuit may buffer the input current without amplification.

An enable block 134 receives an enable signal from an external source. The external source may be a controller that generates an analog or digital enable signal that is applied to a pad on integrated circuit 100 or transmitted via an interface (e.g., a two wire serial interface). In response to the enable signal, the enable block 134 opens or closes switch 122 to provide the burn-in current to the laser diode 110. In the embodiment shown in FIG. 3, switch 122 is implemented using a field effect transistor. It is understood that other switch elements may be used to couple the burn-in current to laser diode 110 and that multiple transistors may be used to provide switch 122 (e.g., a multiple transistor pass gate).

Enable block 134 also sends signals to switches 142 and 144. When switch 142 is closed, the gates of transistors 132 are connected to ground disabling these FETs. Similarly, when switch 144 is closed, the gates of transistors 133 are connected to Vcc disabling these FETs. Since the burn-in circuit 120 is operated during manufacturing, it is preferable to disable the current mirror amplifier once the burn-in process is complete. This prevents the burn-in circuit 120 from generating stray currents that may effect operation of the integrated circuit 100.

In operation, when burn-in is to be performed, the enable signal is provided to enable block 134. This causes switch 122 to close and switches 142 and 144 to open. Current from current source 124 is amplified by the burn-in circuit 120 and provided to the laser diodes 110 through switches 122. When the burn-in process is complete, the enable signal changes states, closing switches 142 and 144 and opening switch 122. This deactivates the burn-in circuit 120 and isolates the burn-in circuit from the laser diode 20.

While exemplary embodiments have been shown and described, various modifications and substitutions may be made thereto without departing from the spirit and scope of the invention. Accordingly, it is to be understood that the present invention has been described by way of illustration and not limitation.

The invention claimed is:

1. An integrated circuit for providing burn-in current to a laser diode, the integrated circuit comprising:
   a laser driver having an output for connection to the laser diode;
   burn-in circuitry formed on said integrated circuit, said burn-in circuitry configured for generating a burn-in current;
   a first switch formed on said integrated circuit, said first switch operative to couple said burn-in current directly to the laser diode in response to a first enable signal provided to said integrated circuit and further operative to directly decouple said burn-in circuit from the laser diode in response to a second enable signal provided to said integrated circuit; and
   a second switch formed on said integrated circuit, said second switch operative to enable said burn-in circuit for generation of said burn-in current in response to said first enable signal, and further operative to disable said burn-in circuit for disabling generation of said burn-in current in response to said second enable signal.

2. The integrated circuit of claim 1 further comprising an input buffer receiving a signal from a communications device.

3. The integrated circuit of claim 2 further comprising a limiting amplifier for amplifying an output signal from said input buffer and providing an amplified signal to said laser driver.

4. The integrated circuit of claim 1 wherein said burn-in circuitry includes an amplifier for supplying a current from a current source to generate said burn-in current.

5. The integrated circuit of claim 4 wherein said amplifier is a current mirror.

6. The integrated circuit of claim 5, wherein said current mirror comprises a FET and the second switch is coupled to a gate terminal of the FET, the second switch operative to bias the gate terminal for turning on the FET when the first enable signal is provided to the integrated circuit.

7. The integrated circuit of claim 6, wherein the second switch is further operative to bias the gate terminal for turning off the FET when the second enable signal is provided to the integrated circuit.

8. The integrated circuit of claim 1 wherein said burn-in circuitry includes a current buffer for supplying a current from a current source to generate said burn-in current.

9. The integrated circuit of claim 1 wherein at least one of said first and second switches comprises a transistor.

10. The integrated circuit of claim 1 wherein:
    said burn-in circuit includes N sections each generating a burn-in current, each section corresponding to an individual laser diode.

11. A system for performing burn-in comprising:
    a current source operative to generate an input current;
    a laser diode; and
    an integrated circuit including:
       a laser driver having an output for connection to said laser diode;
       burn-in circuitry formed on said integrated circuit, said burn-in circuitry configured to receive the input current and generate therefrom a burn-in current;
       a first switch formed on said integrated circuit, said first switch operative to couple said burn-in current directly to said laser diode in response to a first enable signal provided to said integrated circuit and further operative to directly decouple said burn-in circuit from the laser diode in response to a second enable signal provided to said integrated circuit; and
       a second switch formed on said integrated circuit, said second switch operative to enable said burn-in circuit for generation of said burn-in current in response to said first enable signal, and further operative to disable said burn-in circuit for disabling generation of said burn-in current in response to said second enable signal.

12. The system of claim 11 further comprising an input buffer receiving a signal from a communications device.

13. The system of claim 12 further comprising a limiting amplifier for amplifying an output signal from said input buffer and providing an amplified signal to said laser driver.

14. The system of claim 11 wherein said burn-in circuitry includes an amplifier for amplifying a current from a current source to generate said burn-in current.

15. The system of claim 14 wherein said amplifier is a current mirror.

16. The system of claim 11 wherein said burn-in circuitry includes a current buffer for supplying a current from a current source to generate said burn-in current.

17. The system of claim 11 wherein at least one of said first and second switches comprises a transistor.

18. The system of claim 11 wherein:
    said burn-in circuit includes N sections each generating a burn-in current, each section corresponding to an individual laser diode.

* * * * *